US012580157B2

(12) United States Patent
Long

(10) Patent No.: US 12,580,157 B2
(45) Date of Patent: Mar. 17, 2026

(54) GRID ASSEMBLY FOR PLASMA PROCESSING APPARATUS

(71) Applicants:Mattson Technology, Inc., Fremont, CA (US); Beijing E-Town Semiconductor Technology Co., Ltd., Beijing (CN)

(72) Inventor: Maolin Long, Santa Clara, CA (US)

(73) Assignees: Beijing E-Town Semiconductor Technology Co., Ltd., Beijing (CN); Mattson Technology, Inc., Fremont, CA (US)

(*) Notice: Subject to any disclaimer, the term of this patent is extended or adjusted under 35 U.S.C. 154(b) by 820 days.

(21) Appl. No.: 17/546,516

(22) Filed: Dec. 9, 2021

(65) Prior Publication Data

US 2022/0208514 A1     Jun. 30, 2022

Related U.S. Application Data

(60) Provisional application No. 63/215,624, filed on Jun. 28, 2021, provisional application No. 63/132,817, filed on Dec. 31, 2020.

(51) Int. Cl.
*H01J 37/32* (2006.01)
*H01L 21/263* (2006.01)

(52) U.S. Cl.
CPC ........ *H01J 37/3244* (2013.01); *H01J 37/321* (2013.01); *H01L 21/263* (2013.01); *H01J 2237/334* (2013.01)

(58) Field of Classification Search
CPC ................ H01J 37/3244; H01J 37/321; H01J 37/32357; H01J 37/32449; H01J 2237/334; H01L 21/263

(Continued)

(56) References Cited

U.S. PATENT DOCUMENTS 4,270,999 A * 6/1981 Hassan ............... H01J 37/3244
                                                204/192.1
4,590,042 A * 5/1986 Drage ................. H01J 37/3244
                                                422/186.04

(Continued)

FOREIGN PATENT DOCUMENTS

| CN | 106486335 A | 3/2017 |
| CN | 111599717 A | 8/2020 |
| CN | 112262228 A | 1/2021 |

*Primary Examiner* — Rodney G Mcdonald

(74) *Attorney, Agent, or Firm* — Dority & Manning, P.A.

(57) ABSTRACT

A grid assembly for injecting process gas to a chamber. The grid assembly including a gas inlet for delivering the process gas to the grid assembly, a plurality of nozzles extending vertically through at least a portion of the grid assembly, and a plurality of layers in a vertical stacked arrangement. The plurality of layers including a top layer including one or more internal gas injection channels configured to receive process gas from the gas inlet, a bottom layer including a plurality of internal gas injection channels having one or more injection apertures configured to deliver the process gas about a horizontal plane to one or more of the plurality of nozzles, and one or more sublayers disposed between the top layer and the bottom layer, each of the one or more sublayers including an increasing number of internal gas injection channels as the one or more sublayers advance from the top layer to the bottom layer. Plasma processing apparatuses and method of processing workpiece are also provided.

17 Claims, 14 Drawing Sheets

(58) Field of Classification Search
USPC ................... 118/723 IR; 156/345.48, 345.34
See application file for complete search history.

(56) References Cited

U.S. PATENT DOCUMENTS

| | | | |
|---|---|---|---|
| 7,658,800 B2 | 2/2010 | Chen et al. | |
| 10,546,729 B2 | 1/2020 | Lubomirsky | |
| 10,577,690 B2 | 3/2020 | Nguyen et al. | |
| 10,633,741 B2 | 4/2020 | Miller et al. | |
| 2004/0149701 A1 * | 8/2004 | Gonzalez .......... | H01J 37/32449 |
| | | | 219/121.51 |
| 2014/0041805 A1 | 2/2014 | Kuga et al. | |
| 2019/0348261 A1 | 11/2019 | Lin et al. | |
| 2021/0285104 A1 | 9/2021 | Kim | |
| 2023/0332291 A1 * | 10/2023 | Varadarajan ...... | H01J 37/32357 |

* cited by examiner

202

204

210

206

202

210

206

212

202

210

220   220   220

212   204   204

400

GRID ASSEMBLY FOR PLASMA PROCESSING APPARATUS

PRIORITY CLAIM

The present application claims the benefit of priority of U.S. Provisional Application Ser. No. 63/132,817, filed on Dec. 31, 2020, titled "Grid Assembly for Plasma Processing Apparatus," which is incorporated herein by reference. The present application claims the benefit of priority of U.S. Provisional Application Ser. No. 63/215,624, filed on Jun. 28, 2021, titled "Grid Assembly for Plasma Processing Apparatus," which is incorporated herein by reference.

FIELD

The present disclosure relates generally to plasma processing apparatus for processing a workpiece, and more particularly to a grid assembly for injecting a process gas into a processing chamber and/or a plasma chamber.

BACKGROUND

Plasma processing is widely used in the semiconductor industry for deposition, etching, resist removal, and related processing of semiconductor wafers and other substrates. Plasma sources (e.g., microwave, ECR, inductive coupling, etc.) are often used for plasma processing to produce high density plasma and reactive species for processing substrates. In plasma dry strip processes, neutral species (e.g., radicals) from a plasma generated in a remote plasma chamber pass through a separation grid into a processing chamber to treat a workpiece, such as a semiconductor wafer. In plasma etch processes, radicals, ions, and other species generated in a plasma directly exposed to the workpiece can be used to etch and/or remove a material on a workpiece.

SUMMARY

Aspects and advantages of embodiments of the present disclosure will be set forth in part in the following description, or may be learned from the description, or may be learned through practice of the embodiments.

Aspects of the present disclosure are directed to a grid assembly for injecting process gas to a chamber. The grid assembly includes a gas inlet for delivering the process gas to the grid assembly, a plurality of nozzles extending vertically through at least a portion of the grid assembly, and a plurality of layers in a vertical stacked arrangement. The plurality of layers includes a top layer including one or more internal gas injection channels configured to receive process gas from the gas inlet, a bottom layer including a plurality of internal gas injection channels having one or more injection apertures configured to deliver the process gas about a horizontal plane to one or more of the plurality of nozzles, and one or more sublayers disposed between the top layer and the bottom layer, each of the one or more sublayers including an increasing number of internal gas injection channels as the one or more sublayers advance from the top layer to the bottom layer.

Aspects of the present disclosure are also directed to a plasma processing apparatus for processing a workpiece. The plasma processing apparatus includes a process chamber, a workpiece support disposed within the processing chamber, the workpiece support configured to support the workpiece during processing, a plasma chamber separated from the processing chamber via a separation grid, and an inductively coupled plasma source configured to generate a plasma in the plasma chamber. The separation grid comprises a grid assembly includes a gas inlet for delivering a first process gas to the grid assembly, a plurality of nozzles extending vertically through at least a portion of the grid assembly, and a plurality of layers in a vertical stacked arrangement. The plurality of layers includes a top layer including one or more internal gas injection channels configured to receive the first process gas from the gas inlet, a bottom layer including a plurality of internal gas injection channels having one or more injection apertures configured to deliver the first process gas about a horizontal plane to one or more of the plurality of nozzles, and one or more sublayers disposed between the top layer and the bottom layer, each of the one or more sublayers including an increasing number of internal gas injection channels as the one or more sublayers advance from the top layer to the bottom layer.

Aspects of the present disclosure are also directed to a method for processing a workpiece in a plasma processing apparatus. The plasma processing apparatus including a plasma chamber and a processing chamber separated by a separation grid. The processing chamber having a workpiece support. The separation grid including a grid assembly including a gas inlet for delivering a first process gas to the grid assembly, a plurality of nozzles extending vertically through at least a portion of the grid assembly, and a plurality of layers in a vertical stacked arrangement. The plurality of layers including a top layer including one or more internal gas injection channels configured to receive the first process gas from the gas inlet, a bottom layer including a plurality of internal gas injection channels having one or more injection apertures configured to deliver the first process gas about a horizontal plane to one or more of the plurality of nozzles, and one or more sublayers disposed between the top layer and the bottom layer, each of the one or more sublayers including an increasing number of internal gas injection channels as the one or more sublayers advance from the top layer to the bottom layer. The method includes admitting a second process gas to the plasma chamber, generating one or more species from the second process gas using a plasma induced in the plasma chamber, admitting the first process gas to the separation grid via the grid assembly as the one or more species pass from the plasma chamber to the processing chamber, and exposing the workpiece to the one or more species to process the workpiece.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
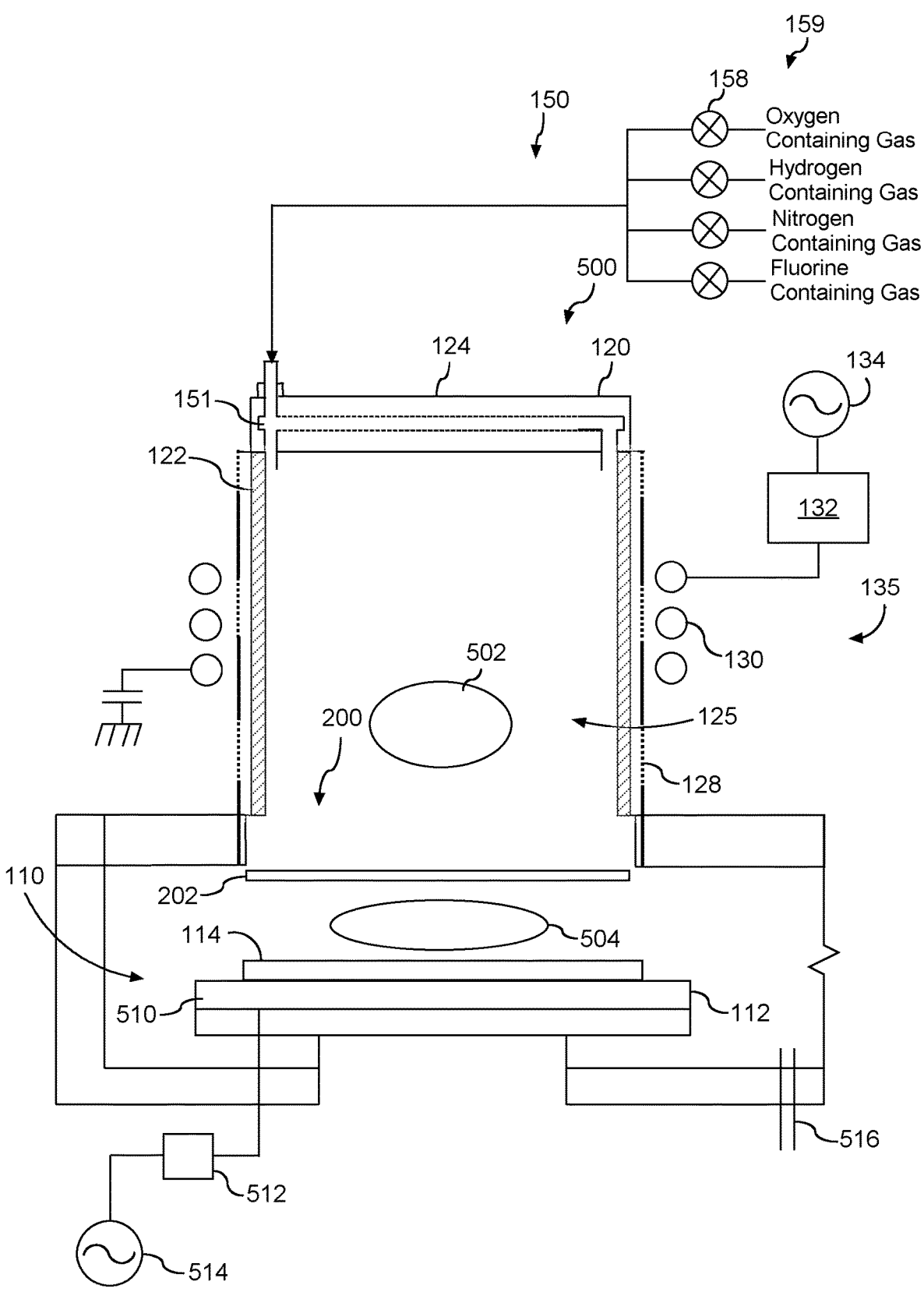
FIG. 1 depicts an example plasma processing apparatus according to example embodiments of the present disclosure.

Example aspects of the present disclosure are directed to a grid assembly configured to provide uniform gas injection for a plasma processing apparatus. For example, the grid assembly can be utilized to provide more uniform process gas injection into a processing chamber or can be used to provide more uniform gas injection into a plasma chamber, such as in a plasma processing apparatus having a remote plasma source. A remote plasma source can include a plasma chamber and a processing chamber that are separated by a separation grid, including the grid assembly. The separation grid can filter ions from the plasma so that neutral species pass through the separation grid to the processing chamber for exposure to a workpiece, such as a semiconductor wafer. In this regard, the grid assembly can define or be incorporated into the separation grid.

Plasma processing of workpieces (e.g., semiconductor wafers) is widely used and can be used to perform a variety of plasma-based processes. For example, plasma etching processes can be performed in order to remove one or more material layers or structures. Plasma deposition processes can be used to deposit one or more material layers on the workpiece. Furthermore, plasma-based surface treatment processes can be used in order to alter the surface morphology or chemical composition of certain layers present on the workpiece. However, while plasma processing has proven to be useful for certain treatment processes, the fact remains that plasma processing can, at times, negatively affect overall uniformity of the workpiece and can also cause device damage. Furthermore, there is a need to provide for more delicate plasma treatment processes in order to avoid device damage.

Further, in some applications, process gases can be activated by a remote plasma of carrier gases that come from the plasma chamber located above the separation grid. In certain instances, the grid assembly can be used to inject process gas into the plasma chamber itself, such that the injected process gas can be activated by a plasma induction source. In such embodiments, the grid assembly can define or be incorporated into a showerhead or gas delivery system generally configured to deliver process gas into the plasma chamber. In other instances, however, the process gases should be injected at a location in a reaction area between the separation grid and the workpiece at the separation grid level or below the separation grid (e.g., post plasma gas injection) to be shielded from RF power used for generating the plasma.

Accordingly, in one aspect, provided herein is a grid assembly for use in plasma processing apparatuses. The grid assembly includes a gas inlet configured to deliver the process gas to the grid assembly; a plurality of nozzles extending vertically through at least a portion of the grid assembly; and a plurality of layers in a vertical stacked arrangement. The plurality of layers includes a top layer including one or more internal gas injection channels configured to receive process gas from the gas inlet; a bottom layer including a plurality of internal gas injection channels having one or more injection apertures configured to deliver the process gas about a horizontal plane to one or more of the plurality of nozzles; and one or more sublayers disposed between the top layer and the bottom layer, each of the one or more sublayers including an increasing number of internal gas injection channels as the one or more sublayers advance from the top layer to the bottom layer. The grid assembly can be incorporated into the separation grid or the showerhead of suitable plasma processing apparatuses.

The grid assembly according to example embodiments of the present disclosure can provide numerous benefits and technical effects. For instance, the grid assembly can more uniformly distribute the process gas to the processing chamber while being maintained in a ground state before entering one or more nozzles disposed within the grid assembly. Accordingly, process gas can be shielded from RF power utilized to activate process gas in the plasma chamber and, instead can remain grounded until mixed with one or more species from the remote plasma in the nozzles of the grid assembly. Such a configuration prevents the process gas from going through the discharge or plasma heating zone in the plasma chamber, and can facilitate more delicate plasma processing of workpieces. Further, the grid assembly is better able to more uniformly distribute process gas to the wafer. Accordingly, workpiece uniformity can be improved and workpiece damage can be avoided.

Aspects of the present disclosure are discussed with reference to a grid assembly used in a remote plasma processing apparatus for purposes of illustration and discussion. Those of ordinary skill in the art, using the disclosure provided herein, will understand that the technology according to example aspects of the present disclosure can be used, for instance, as a showerhead to deliver process gas directly to a processing chamber and/or plasma chamber of a plasma processing apparatus (e.g., of an upper electrode in a capacitively coupled plasma source (CCP)). In such an embodiment, the grid assembly may or may not have through holes for nozzles. In such embodiments, nozzles may be provided only in lower layers of the grid assembly or the bottom of the assembly in order to uniformly distribute process gas to the processing chamber and/or plasma chamber.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Aspects of the present disclosure are discussed with reference to a "workpiece" "wafer" or semiconductor wafer for purposes of illustration and discussion. Those of ordinary skill in the art, using the disclosures provided herein, will understand that the example aspects of the present disclosure can be used in association with any semiconductor workpiece or other suitable workpiece. In addition, the use of the term "about" in conjunction with a numerical value is intended to refer to within ten percent (10%) of the stated numerical value. A "pedestal" refers to any structure that can be used to support a workpiece. A "remote plasma" refers to a plasma generated remotely from a workpiece, such as in a plasma chamber separated from a workpiece by a separation grid. A "direct plasma" refers to a plasma that is directly exposed to a workpiece, such as a plasma generated in a processing chamber having a pedestal operable to support the workpiece.

FIG. 1 depicts an example plasma processing apparatus 500 that can be used to implement workpiece treatment processes according to example embodiments of the present disclosure. The plasma processing apparatus includes a processing chamber 110 and a plasma chamber 120 that is separated from the processing chamber 110. Processing chamber 110 includes a workpiece holder 112 or pedestal operable to hold a workpiece 114 to be processed, such as a semiconductor wafer. In this example illustration, a plasma 502 is generated in plasma chamber 120 (i.e., plasma generation region) by an inductively coupled plasma source 135 and desired species from the first plasma 502 are channeled from the plasma chamber 120 to the surface of workpiece 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. Dielectric side wall 122 can be formed from a ceramic material. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases can be provided to the chamber interior from gas supply 150 and annular gas distribution channel 151 or other suitable gas introduction mechanism, such as the grid assembly disclosed herein, which will be further discussed hereinbelow. When the induction coil 130 is energized with RF power from the RF power generator 134, a plasma 502 can be generated in the plasma chamber 120. In a particular embodiment, the plasma processing apparatus 500 can include an optional grounded Faraday shield 128 to reduce capacitive coupling of the induction coil 130 to the plasma 502. While one induction coil 130 is shown, the disclosure is not so limited. Indeed, any number of induction coils or induction coil assemblies can be utilized herein in order to generate plasma in the plasma chamber 120.

The example plasma processing apparatus 500 of FIG. 1 is operable to generate a first plasma 502 (e.g., a remote plasma) in the plasma chamber 120 and a second plasma 504 (e.g., a direct plasma) in the processing chamber 110. The first plasma 502 can be generated by an inductively coupled plasma source. The second plasma 504 can be generated by, for instance, a capacitively coupled plasma source (e.g., bias).

More particularly, the plasma processing apparatus 500 includes a bias source having bias electrode 510 in the workpiece support 112. The bias electrode 510 can be coupled to an RF power generator 514 via a suitable matching network 512. When the bias electrode 510 is energized with RF energy, a second plasma 504 can be generated from the filtered mixture or process gas in the processing chamber 110 for direct exposure to the workpiece 114. The processing chamber 110 can include a gas exhaust port 516 for evacuating a gas from the processing chamber 110.

In some embodiments, the workpiece support 112 is configured such that a DC bias can be applied to the workpiece 114. In some embodiments, DC power is applied to the bias electrode 510 located in the workpiece support 112. The DC bias can be applied to generate an electric field such that certain species can be attracted and/or accelerated towards the workpiece 114. With application of a DC bias to the workpiece 114, the flux of certain ionic species can be controlled. This can facilitate polymer film growth or radical etching on the structure of the workpiece 114. In some embodiments, the DC bias applied or provided to the bias electrode is from about 50 W to about 150 W. The DC bias may be applied to the workpiece 114 to accelerate certain species from the first plasma 502 and/or the second plasma 504 towards the workpiece 114.

As shown in FIG. 1, according to example aspects of the present disclosure, the apparatus 500 can include a gas delivery system 155 configured to deliver process gas to the plasma chamber 120, for instance, via a gas distribution channel 151 or other distribution system (e.g., showerhead). The gas delivery system 155 can include a plurality of feed gas lines 159. The feed gas lines 159 can be controlled using valves 158 and/or gas flow controllers 185 to deliver a desired amount of gases into the plasma chamber 120 as process gas. The gas delivery system 155 can be used for the delivery of any suitable process gas. Example process gases include, oxygen-containing gases (e.g. $O_2$, $O_3$, $N_2O$, $H_2O$), hydrogen-containing gases (e.g., $H_2$, $D_2$), nitrogen-containing gas (e.g. $N_2$, $NH_3$, $N_2O$), fluorine-containing gases (e.g. $CF_4$, $C_2F_4$, $CHF_3$, $CH_2F_2$, $CH_3F$, $SF_6$, $NF_3$), hydrocarbon-containing gases (e.g. $CH_4$), or combinations thereof. Other feed gas lines containing other gases can be added as needed. In some embodiments, the process gas can be mixed with an inert gas that can be called a "carrier" gas, such as He, Ar, Ne, Xe, or $N_2$. A control valve 158 can be used to control a flow rate of each feed gas line to flow a process gas into the plasma chamber 120. In embodiments, the gas delivery system 155 can be controlled with a gas flow controller 185.

As shown in FIG. 1, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber 110. Furthermore, the separation grid 200 can include a grid assembly 202 as will be further disclosed herein. The grid assembly 202 can be used to provide one or more process gases to the filtered mixture and/or to the processing chamber 110. In certain embodiments, additionally and/or alternatively the separation grid 200 can be a multi-plate separation grid. For instance, the separation grid 200 can include a first grid plate and a second grid plate that are spaced apart in parallel relationship to one another. The first grid plate and the second grid plate can be separated by a distance.

The first grid plate can have a first grid pattern having a plurality of holes. The second grid plate can have a second grid pattern having a plurality of holes. The first grid pattern can be the same as or different from the second grid pattern. Charged particles can recombine on the walls in their path through the holes of each grid plate in the separation grid. Neutral species (e.g., radicals) can flow relatively freely through the holes in the first grid plate and the second grid plate. The size of the holes and thickness of each grid plate and can affect transparency for both charged and neutral particles.

In some embodiments, the first grid plate can be made of metal (e.g., aluminum) or other electrically conductive material and/or the second grid plate can be made from either an electrically conductive material or dielectric material (e.g., quartz, ceramic, etc.). In some embodiments, the first grid plate and/or the second grid plate can be made of other materials, such as silicon or silicon carbide. In the event a grid plate is made of metal or other electrically conductive material, the grid plate can be grounded.

Figure 2:
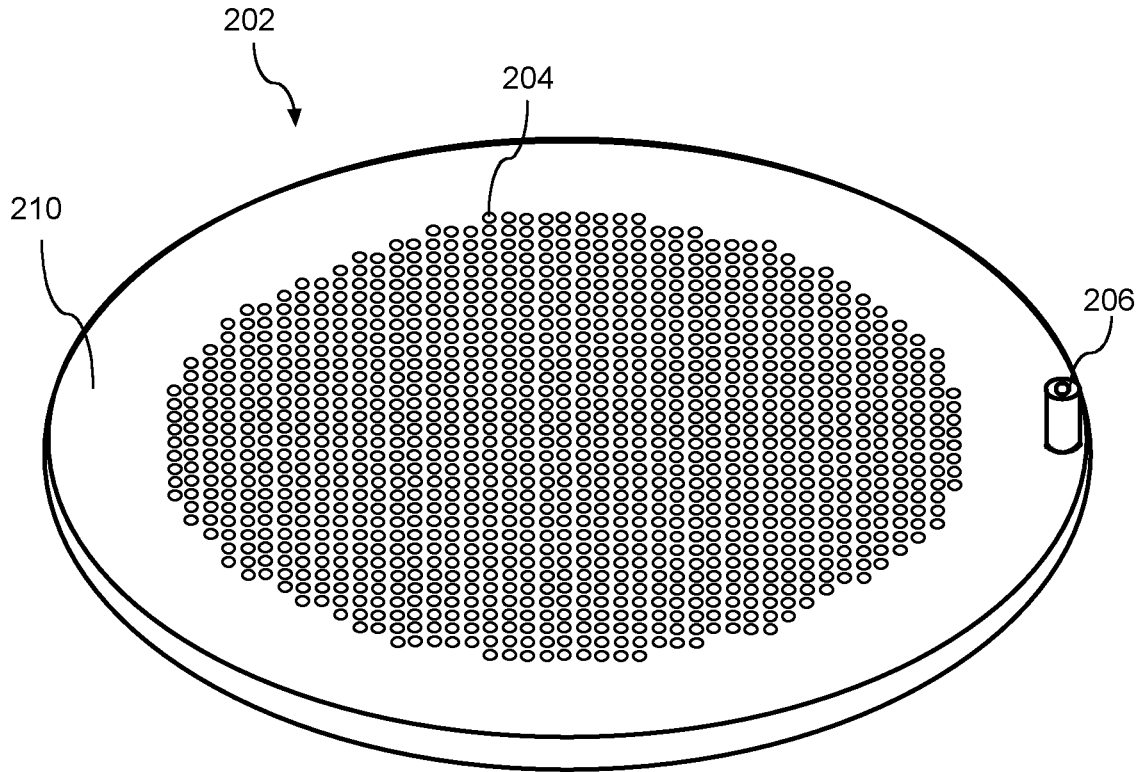
FIG. 2 depicts an example top-down perspective view of an example grid assembly according to example embodiments of the present disclosure.
Figure 3:
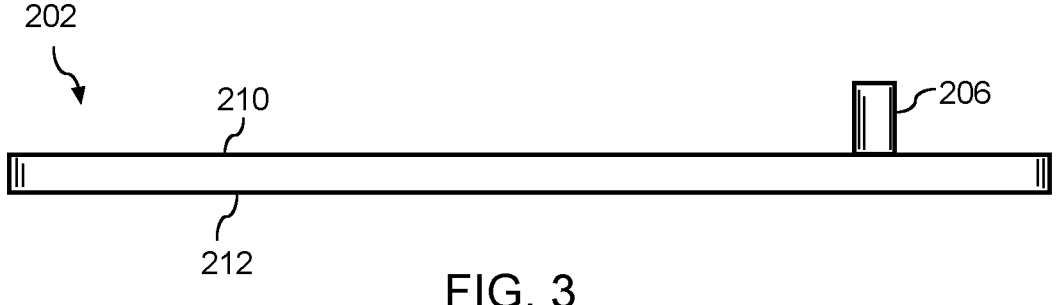
FIG. 3 depicts an example side vide of an example grid assembly according to example embodiments of the present disclosure.
Figure 4:
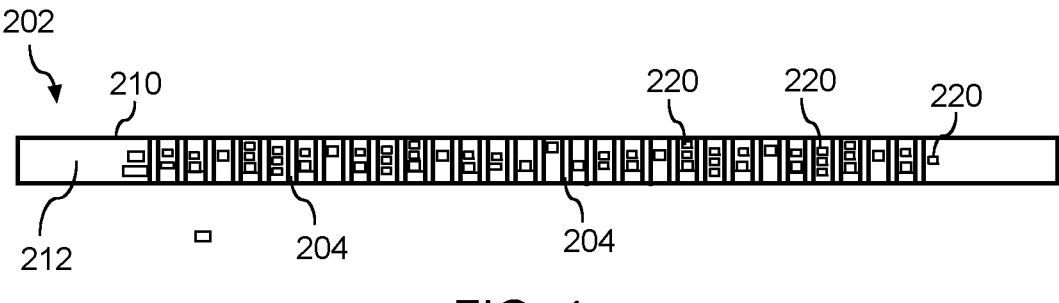
FIG. 4 depicts an example cross-sectional view of an example grid assembly according to example embodiments of the present disclosure.

As noted, the separation grid 200 can include grid assembly 202. FIG. Grid assembly 202 will be further discussed herein with reference to FIGS. 2-14. For example, FIG. 2 illustrate a top-down view of grid assembly 200 showing one or more nozzles 204 distributed throughout the grid assembly 200. As shown, the one or more nozzles 204 can be through nozzles that extend from the top surface of the grid assembly 200 to the bottom surface of the grid assembly. Accordingly, when a plasma 502 is generated in the plasma chamber 120, one or more species can flow through the one or more nozzles 204 from the plasma chamber 120 and in to the processing chamber 110. FIG. 2 also illustrates a gas inlet 206, that is used to provide process gas to the grid assembly 202. FIG. 3 illustrates a side view of the grid assembly 202 including gas inlet 206, while FIG. 4 illustrates a cross-sectional view of the grid assembly 202 including gas inlet 206. Furthermore, as shown in FIG. 4, the nozzles 204 extend from a top surface 210 of the grid assembly 202 to a bottom surface 212 of the grid assembly 202. Without being bound by any particular configuration, in certain embodiments, the top surface 210 of the grid assembly 202 is disposed in closer relation to the plasma chamber 120, while the bottom surface 212 of the grid assembly 202 is disposed in closer relation to the processing chamber 110. As shown, in FIG. 4, the grid assembly further includes one or more internal gas injections channels 220 (e.g. a plurality of internal gas injection channels 220) disposed throughout the grid assembly 202.

Figure 5:
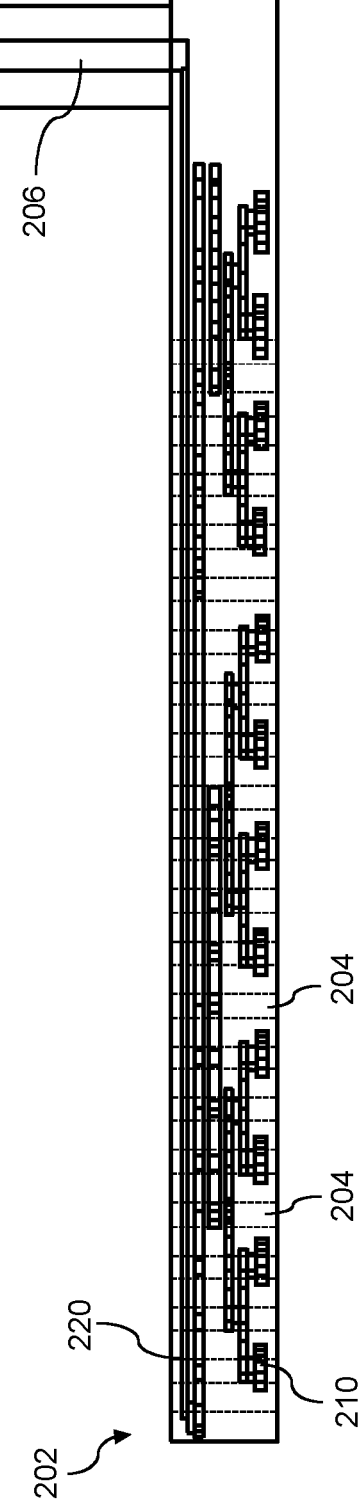
FIG. 5 depicts an example partial cross-sectional view of an example grid assembly according to example embodiments of the present disclosure.
Figure 6:
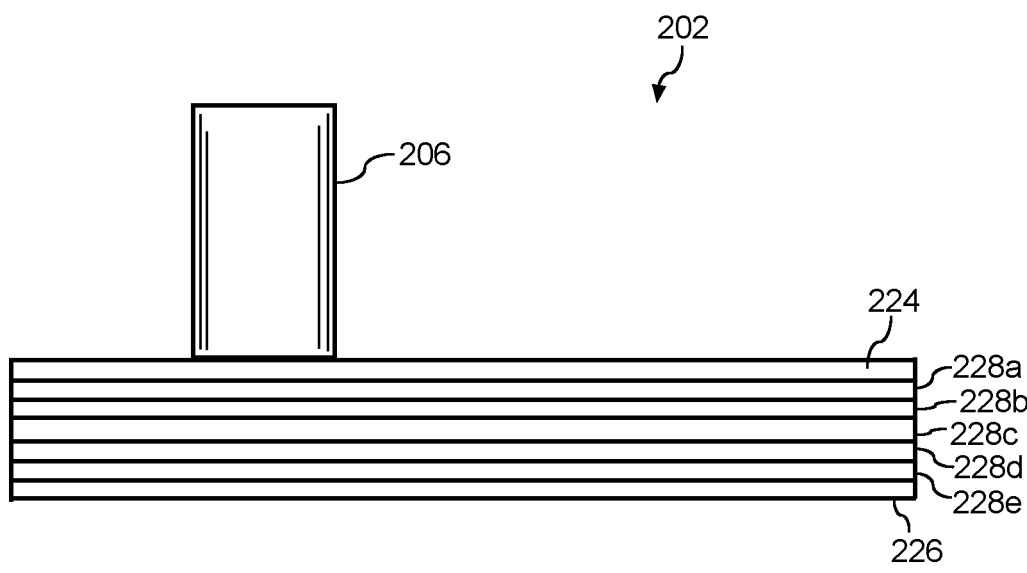
FIG. 6 depicts an example cross-sectional view of an example grid assembly according to example embodiments of the present disclosure.

As shown in FIG. 5, the grid assembly 202 can include a plurality of layers. In embodiments, the plurality of layers can be integrally formed, such that the grid assembly 202 appears as a solid structure having one or more internal gas injection channels 220 distributed therein. For example, in certain embodiments, the grid assembly can include a top layer 224 generally defining a portion of the top surface 210 of the grid assembly 202 and a bottom layer 226 generally defining a portion of the bottom surface 212 of the grid assembly 202. One or more sublayers 228 can be disposed between the top layer 224 and the bottom layer 226. For example, in embodiments the grid assembly 202 includes one sublayer 228, while in other embodiments the grid assembly 202 includes more than one sublayer 228, such as at least two sublayers 228, such as at least three sublayers 228, such as at least four sublayers 228, such as at least five sublayers 228, such as at least six sublayers 228, etc. The number of sublayers utilized may depend on the overall number and configuration of internal gas injection channels 220 and/or nozzles 204 as will be further discussed hereinbelow. For example, as shown in FIG. 5, the grid assembly includes top layer 224, bottom layer 226, and at least 5 sublayers (228a, 228b, 228c, 228d, 228e). As shown generally in FIG. 5, the gas inlet 206 delivers process gas to the top layer 224.

As will be discussed further with reference to FIGS. 7A-13A, each of the layers (e.g., top layer 224, bottom layer 226, and sublayers 228) include one or more internal gas injection channels 220 disposed therein. Generally, the internal gas injection channels 220 are disposed in the grid assembly 202 in a branched configuration and proceed to continually branch as they advance down through the layers from the top layer 224 to the bottom layer 226, where upon reaching the bottom layer 226, the internal gas injection channels 220 deliver process gas via an injection aperture 250 about a horizontal plane to one or more of the plurality of nozzles 204 (e.g., such as all of the nozzles). Embodiments of each layer (e.g., top layer 224, bottom layer 226, and sublayers 228) will now be discussed with reference to FIGS. 7A-13A, which each illustrate a top-down view and/or enlarged view of each layer. Such embodiments are exemplary in nature and other embodiments can be utilized in the grid assembly 202 disclosed herein. For example, as shown in the representative figures, the branches can be quadruplets, however, any number of branches or branch configurations can be used.

Figure 7A:
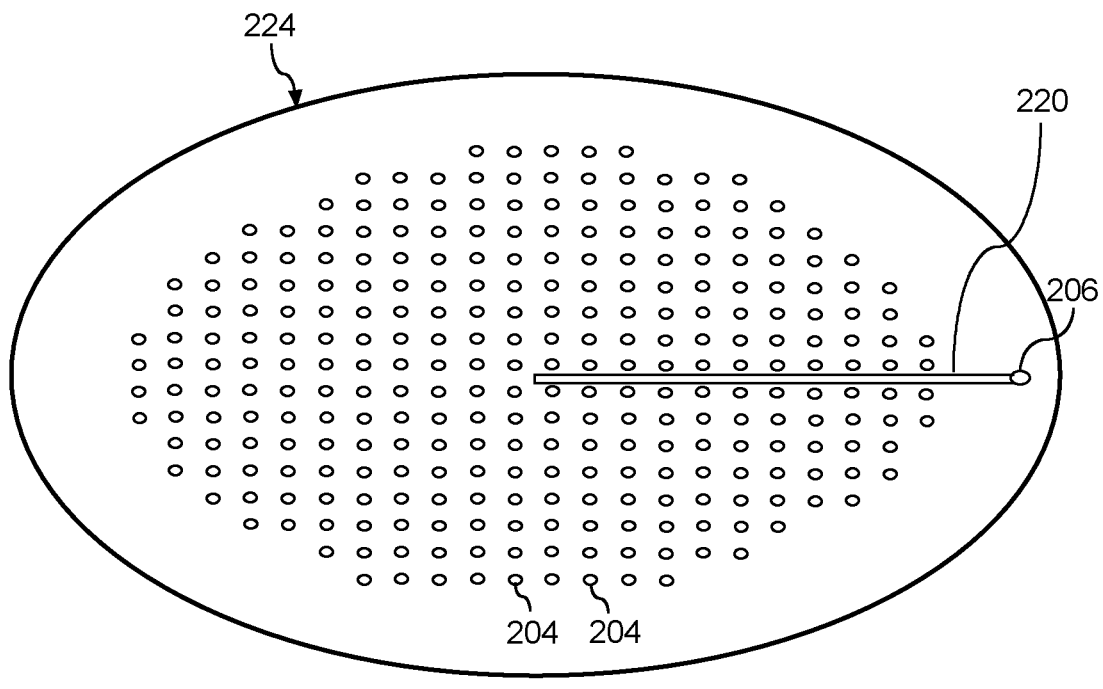
FIG. 7A depicts an example top-down view of an example top layer of an example grid assembly according to example embodiments of the present disclosure.
Figure 7B:
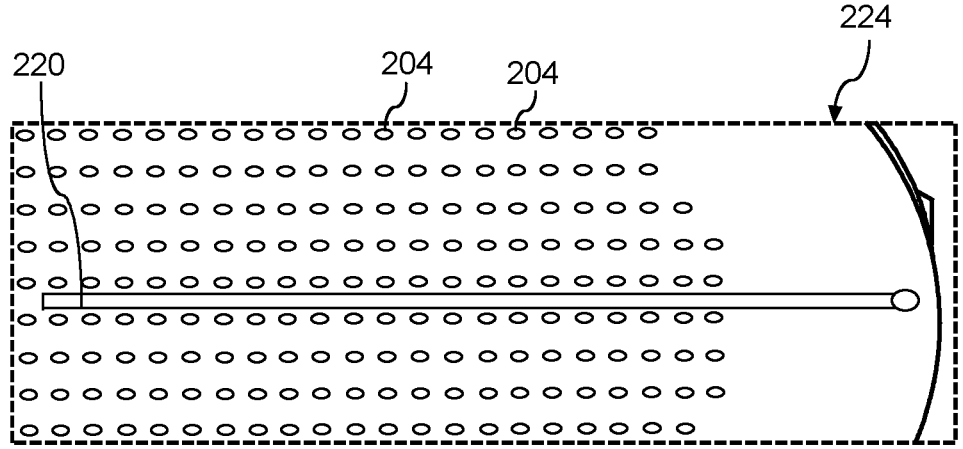
FIG. 7B depicts an enlarged partial view of FIG. 7A.

FIGS. 7A and 7B illustrate an example top layer 224 for the grid assembly 202. For instance, the top layer 224 includes one or more internal gas injection channels 220 configured to receive process gas from gas inlet 206. As shown, top layer 224 includes one internal gas injection channel 220 that runs across the horizontal plane of the top layer 224 and does not intersect with or interact with any of the plurality of nozzles 204 disposed therein. The internal gas injection channel 220 in the top layer 224 can run from the gas inlet 206 to generally the center of the top layer 224, such that process gas can be supplied to the center of the top layer 224. As shown, the top layer 224 includes only one internal gas injection channel however, the top layer 224 can include more than one internal gas injection channel 220 for distribution gas throughout the top layer 224.

Figure 8A:
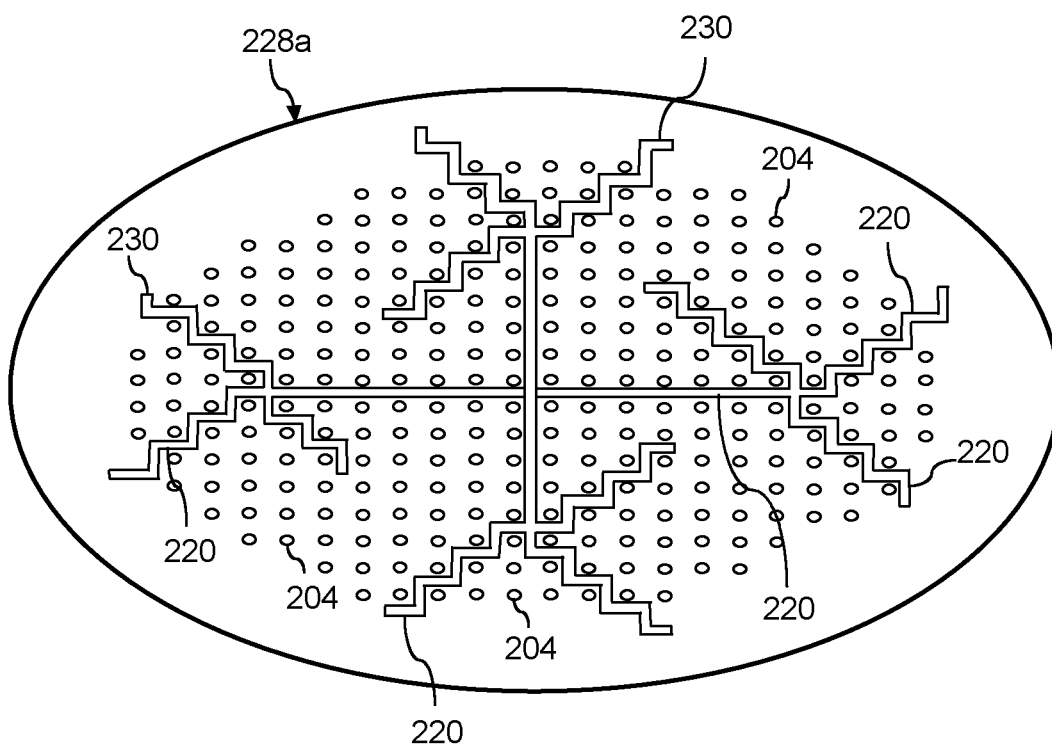
FIG. 8A depicts an example top-down view of an example sublayer of an example grid assembly according to example embodiments of the present disclosure.
Figure 8B:
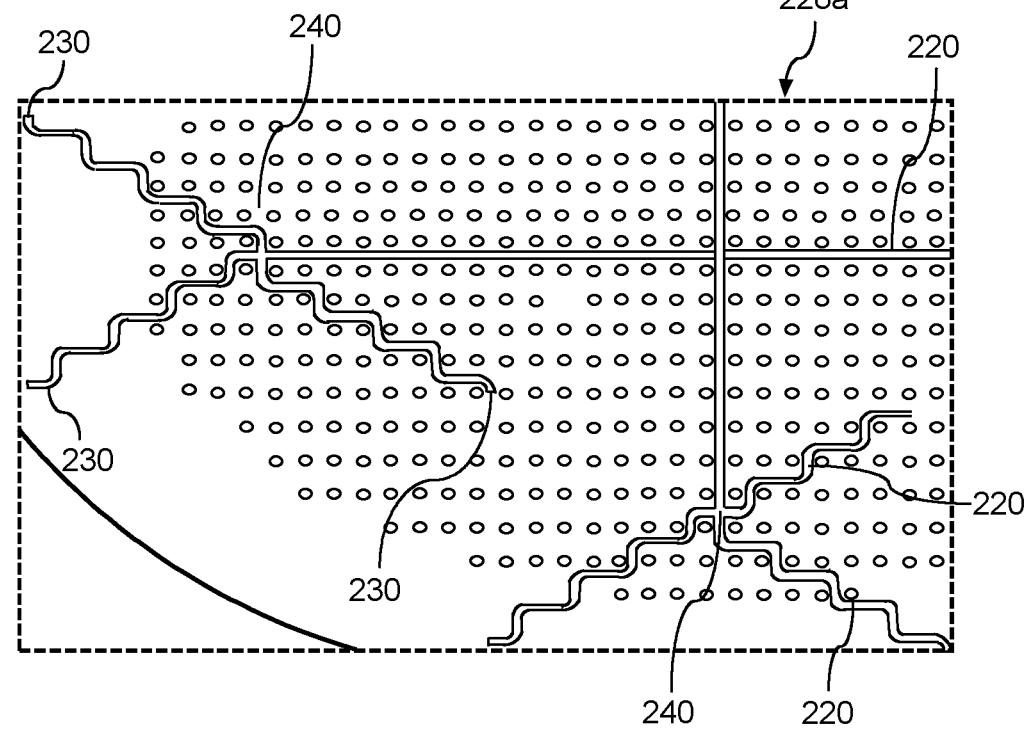
FIG. 8B depicts an enlarged partial view of FIG. 8A.

FIGS. 8A and 8B illustrate an example sublayer 228a that is adjacent to a bottom surface of the top layer 224. In other words, sublayer 228a is located beneath the top layer 224 in the z-direction. As shown, sublayer 228a includes four internal gas injection channels 220 branching out from the center of sublayer 228. For example, the four internal gas injection channels 220 disposed in sublayer 228*a* are configured to receive process gas from internal gas injection channel 220 disposed in the top layer 224 generally about the center of the sublayer 228*a*. In embodiments, at the ends 230 of the internal gas injection channels 220, each of the internal gas injection channels 220 further branches into one or more internal gas injection channels 220. For example, as shown, extending from the initial four internal gas injection channels 220 are three additional branches of internal gas injection channels 220. While a branch of at least three additional internal gas injection channels 220 is shown, the disclosure is not so limited. In fact, the branching could be a branch of at least two internal gas injection channels 220, at least three internal gas injection channels 220, at least four internal gas injection channels 220, at least five internal gas injections channels 220, etc. Furthermore, as shown, in embodiments none of the internal gas injection channels 220 in sublayer 228*a* come into contact with or intersect with any of the nozzles 204 disposed therein.

Figure 9A:
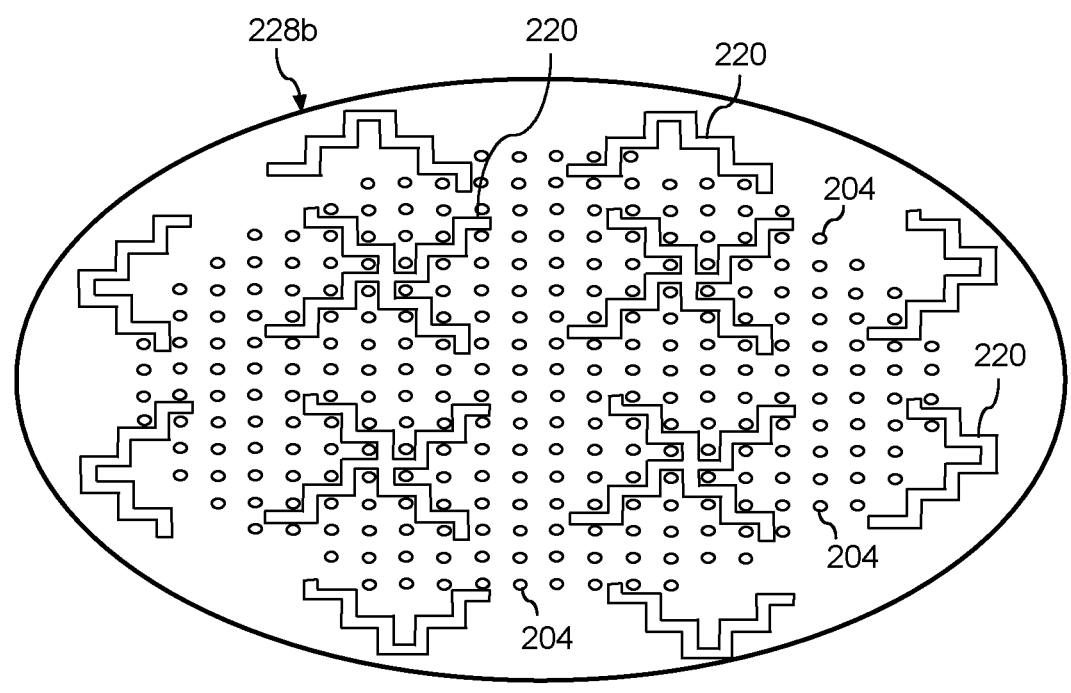
FIG. 9A depicts an example top-down view of an example sublayer of an example grid assembly according to example embodiments of the present disclosure.
Figure 9B:
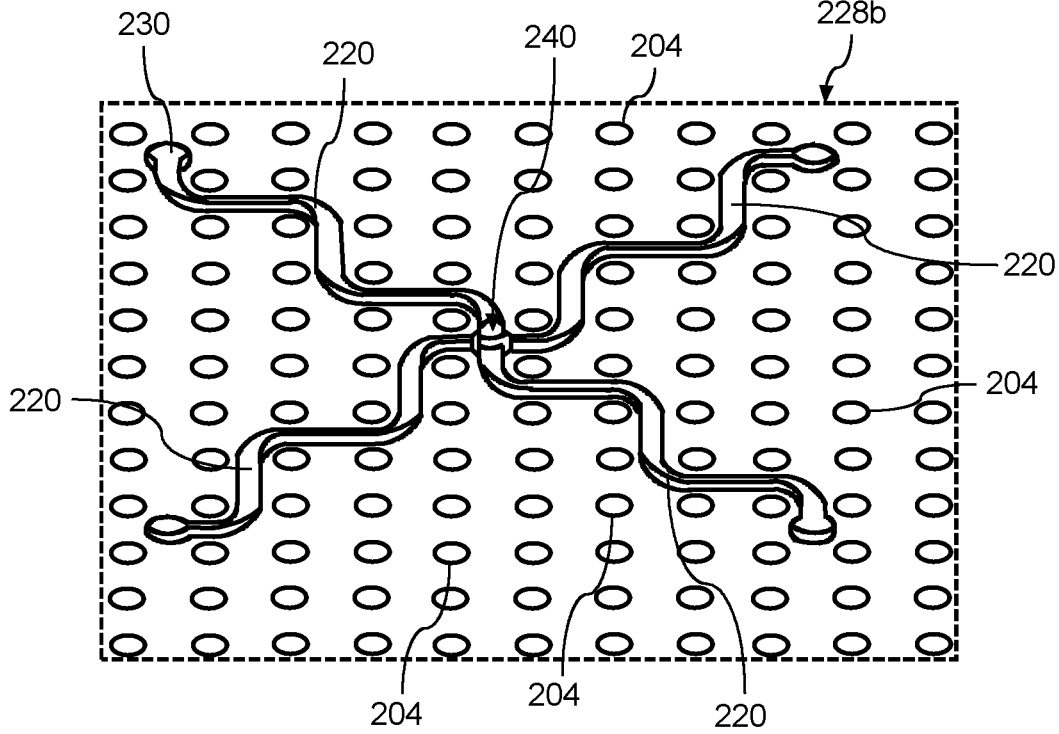
FIG. 9B depicts an enlarged partial view of FIG. 9A.

FIGS. 9A and 9B illustrate an example sublayer 228*b* that is adjacent to a bottom surface of sublayer 228*a*. In other words, sublayer 228*b* is located beneath sublayer 228*a* in the z-direction. As shown, sublayer 228*b* includes a plurality of internal gas injection channels 220. The internal gas injection channels 220 are each supplied by gas from the ends of the branches of internal gas injection channels 220 disposed in sublayer 228*a*. For example, as shown particularly in FIG. 9B, the center 240 of the branched internal gas injection channels 220 can be supplied with gas from one of the ends of internal gas injection channels 220 disposed in sublayer 228*a*. Furthermore, as shown, the internal gas injection channels 220 of sublayer 228*b* branch out from the center 240 and can include a variety of branch patterns or number of branches. For example, as shown, the branches can include at least two internal gas injection channels 220, such as at least three internal gas injection channels 220, such as at least four internal gas injection channels 220, such as at least five internal gas injection channels etc. As shown, in embodiments none of the internal gas injection channels 220 in sublayer 228*b* come into contact with or intersect with any of the nozzles 204 disposed therein.

Figure 10A:
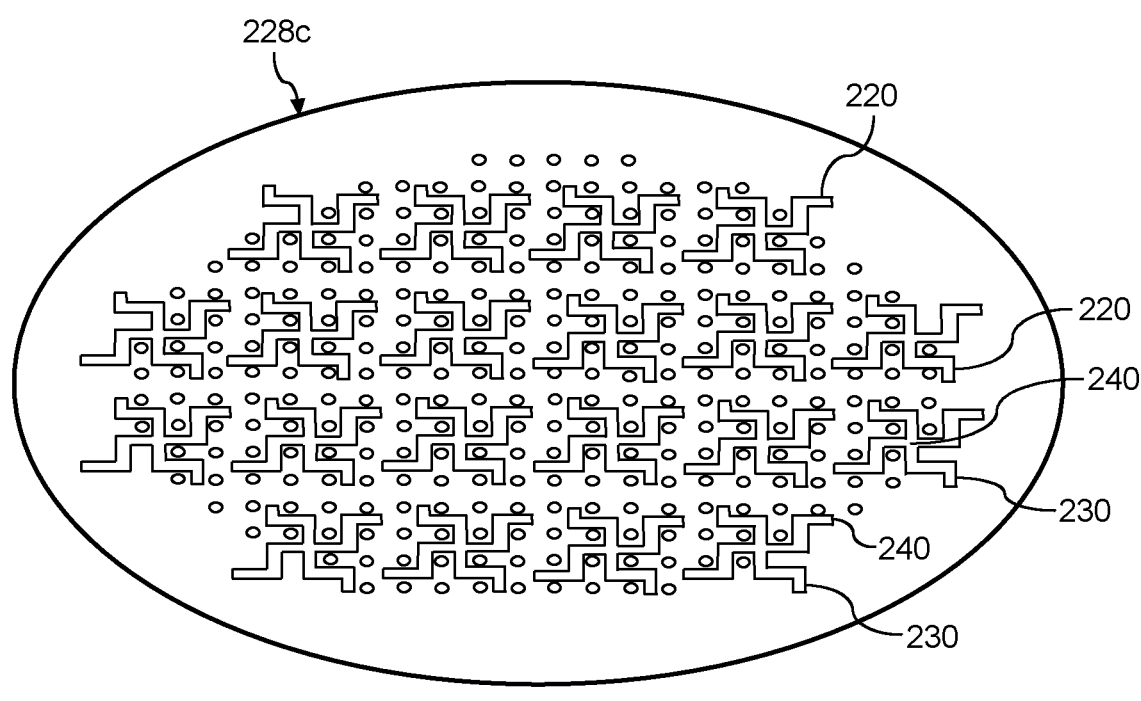
FIG. 10A depicts an example top-down view of an example sublayer of an example grid assembly according to example embodiments of the present disclosure.
Figure 10B:
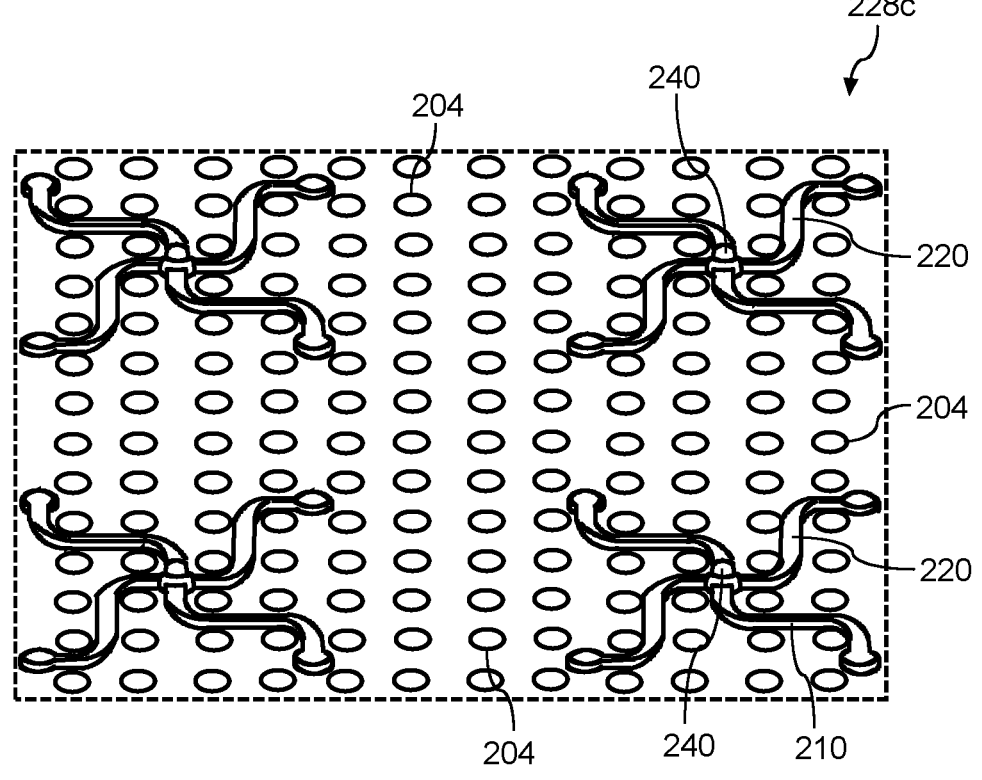
FIG. 10B depicts an enlarged partial view of FIG. 10A.

FIGS. 10A and 10B illustrate an example sublayer 228*c* that is adjacent to a bottom surface of sublayer 228*b*. In other words, sublayer 228*c* is located beneath sublayer 228*b* in the z-direction. As shown, sublayer 228*c* includes a plurality of internal gas injection channels 220. The internal gas injection channels 220 are each supplied by gas from the ends of the branches of internal gas injection channels 220 disposed in sublayer 228*b*. For example, as shown particularly in FIG. 10B, the center 240 of the internal gas injection channels 220 can be supplied with gas from one of the ends of internal gas injection channels 220 disposed in sublayer 228*b*. Furthermore, as shown, the internal gas injection channels 220 of sublayer 228*c* branch out from the center 240 and can include a variety of branch patterns or number of branches. For example, as shown, the branches can include at least two internal gas injection channels 220, such as at least three internal gas injection channels 220, such as at least four internal gas injection channels 220, such as at least five internal gas injection channels 220 etc. As shown, in embodiments none of the internal gas injection channels 220 in sublayer 228*c* come into contact with or intersect with any of the nozzles 204 disposed therein.

Figure 11A:
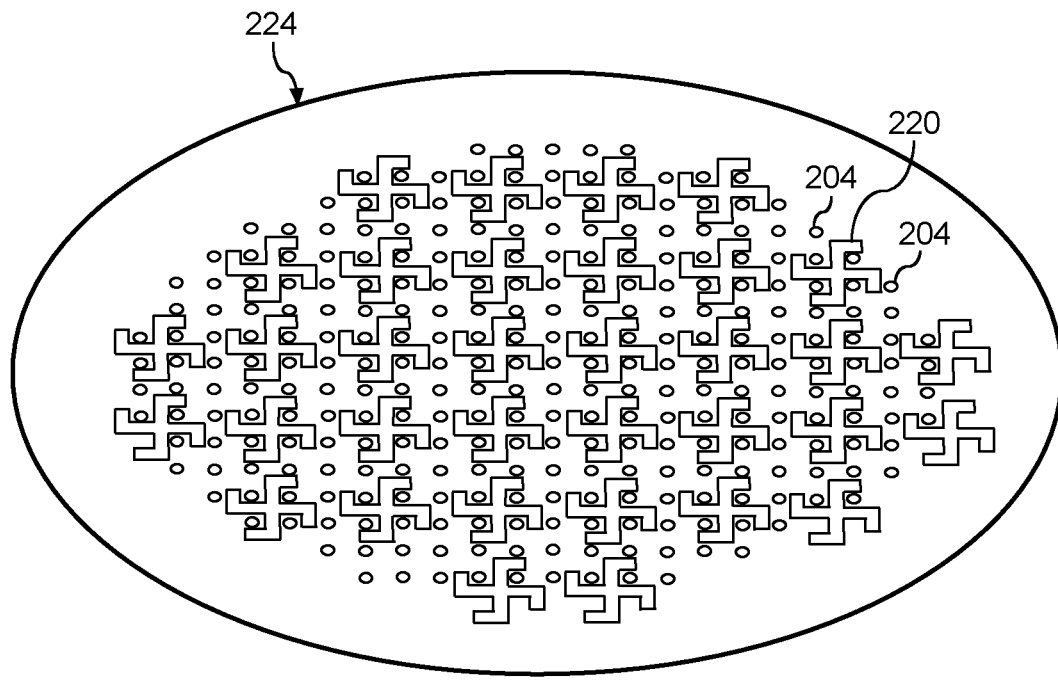
FIG. 11A depicts an example top-down view of an example sublayer of an example grid assembly according to example embodiments of the present disclosure.
Figure 11B:
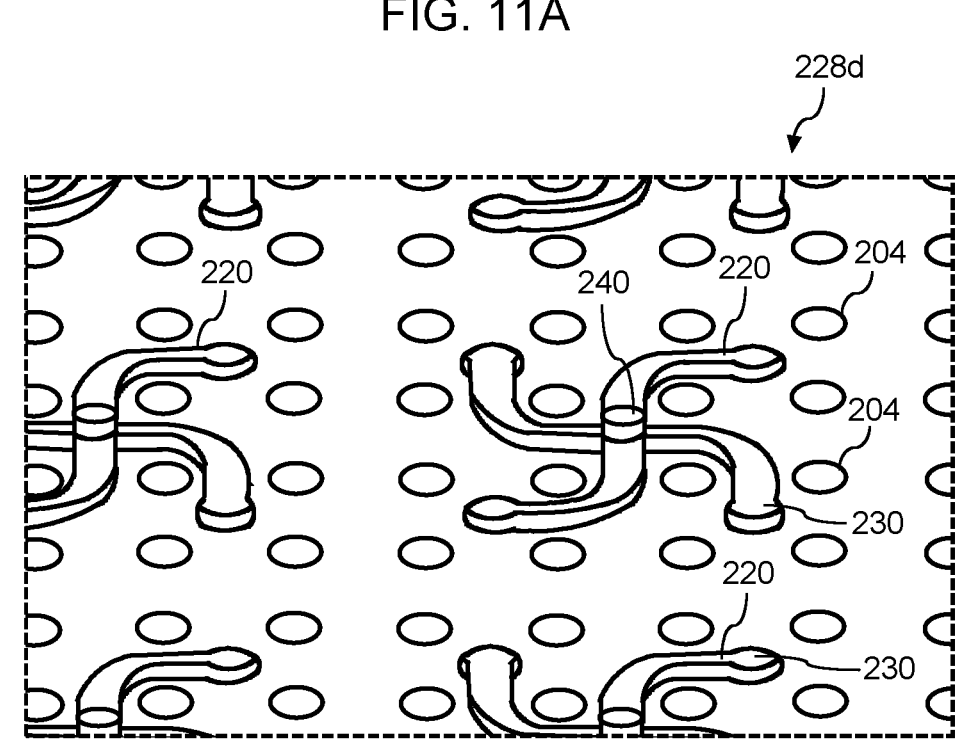
FIG. 11B depicts an enlarged partial view of FIG. 11A.

FIGS. 11A and 11B illustrate an example sublayer 228*d* that is adjacent to a bottom surface of sublayer 228*c*. In other words, sublayer 228*d* is located beneath sublayer 228*c* in the z-direction. As shown, sublayer 228*d* includes a plurality of internal gas injection channels 220. The internal gas injection channels 220 are each supplied by gas from the ends of the branches of internal gas injection channels 220 disposed in sublayer 228*c*. For example, as shown particularly in FIG. 11B, the center 240 of the internal gas injection channels 220 can be supplied with gas from one of the ends of internal gas injection channels 220 disposed in sublayer 228*c*. Furthermore, as shown, the internal gas injection channels 220 of sublayer 228*d* branch out from the center 240 and can include a variety of branch patterns or number of branches. For example, as shown, the branches can include at least two internal gas injection channels 220, such as at least three internal gas injection channels 220, such as at least four internal gas injection channels 220, such as at least five internal gas injection channels 220 etc. As shown, in embodiments none of the internal gas injection channels 220 in sublayer 228*d* come into contact with or intersect with any of the nozzles 204 disposed therein.

Figure 12A:
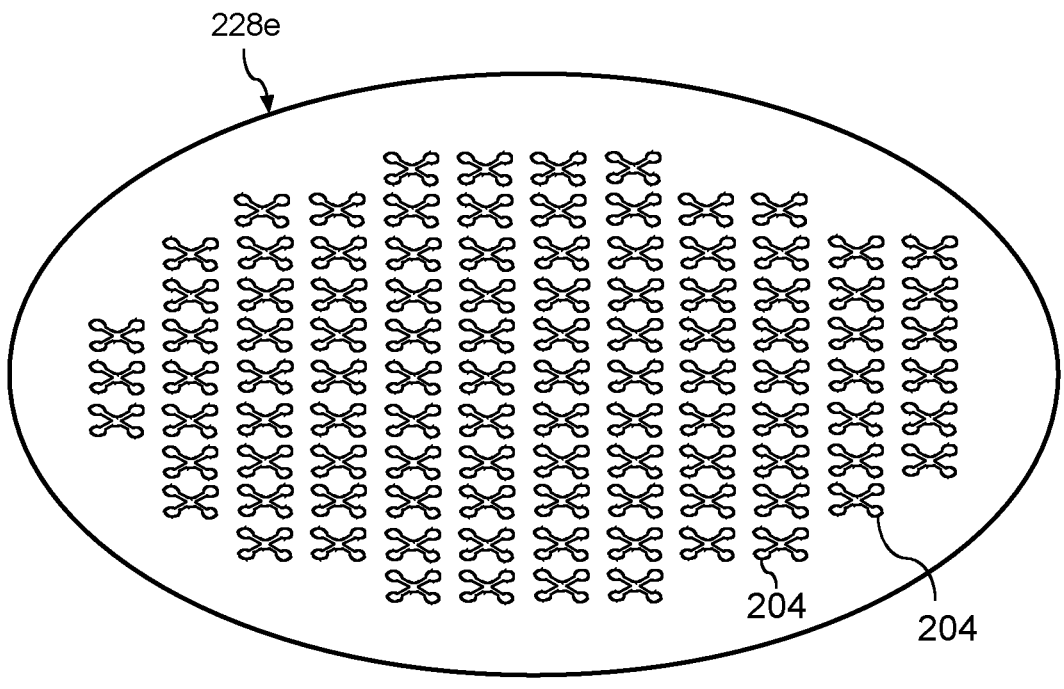
FIG. 12A depicts an example top-down view of an example sublayer of an example grid assembly according to example embodiments of the present disclosure.
Figure 12B:
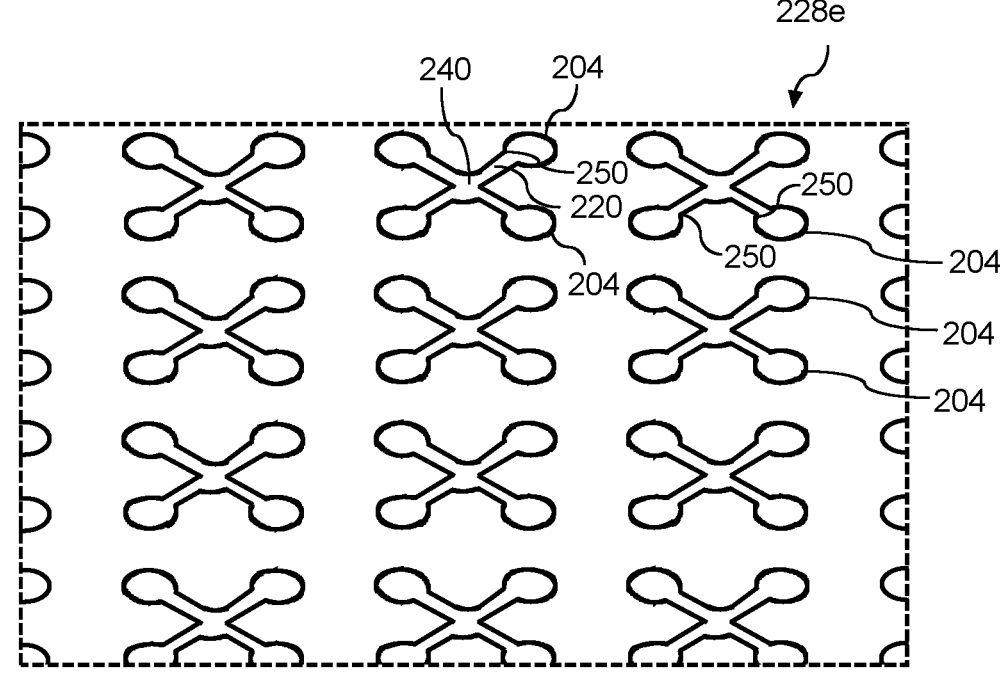
FIG. 12B depicts an enlarged partial view of FIG. 12A.

FIGS. 12A and 12B illustrate an example sublayer 228*e* that is adjacent to a bottom surface of sublayer 228*d*. In other words, sublayer 228*e* is located beneath sublayer 228*d* in the z-direction. As shown, sublayer 228*e* includes a plurality of internal gas injection channels 220. The internal gas injection channels 220 are each supplied by gas from the ends of the branches of internal gas injection channels 220 disposed in sublayer 228*d*. For example, as shown particularly in FIG. 12B, the center 240 of the internal gas injection channels 220 can be supplied with gas from one of the ends of internal gas injection channels 220 disposed in sublayer 228*d*. As shown, the center 240 of the internal gas injection channels 220 supplies gas to at least four internal gas injection channels 220 that then each supply process gas via a gas injection aperture 250 to one or more nozzles 204. Accordingly, there are four branches of internal gas injection channels 220 extending between the center 240 and the nozzles 204 to supply process gas to at least four nozzles 204. However, the disclosure is not so limited. For example, the internal gas injection channels 220 of sublayer 228*e* can branch out from the center 240 and can include a variety of branch patterns or number of branches. For example, the branches can include at least two internal gas injection channels 220, such as at least three internal gas injection channels 220, such as at least four internal gas injection channels 220, such as at least five internal gas injection channels 220 etc. As shown, in embodiments, each of the ends 230 of the internal gas injection channels in sublayer 228*e* contact the nozzles 204 disposed therein.

Figure 13A:
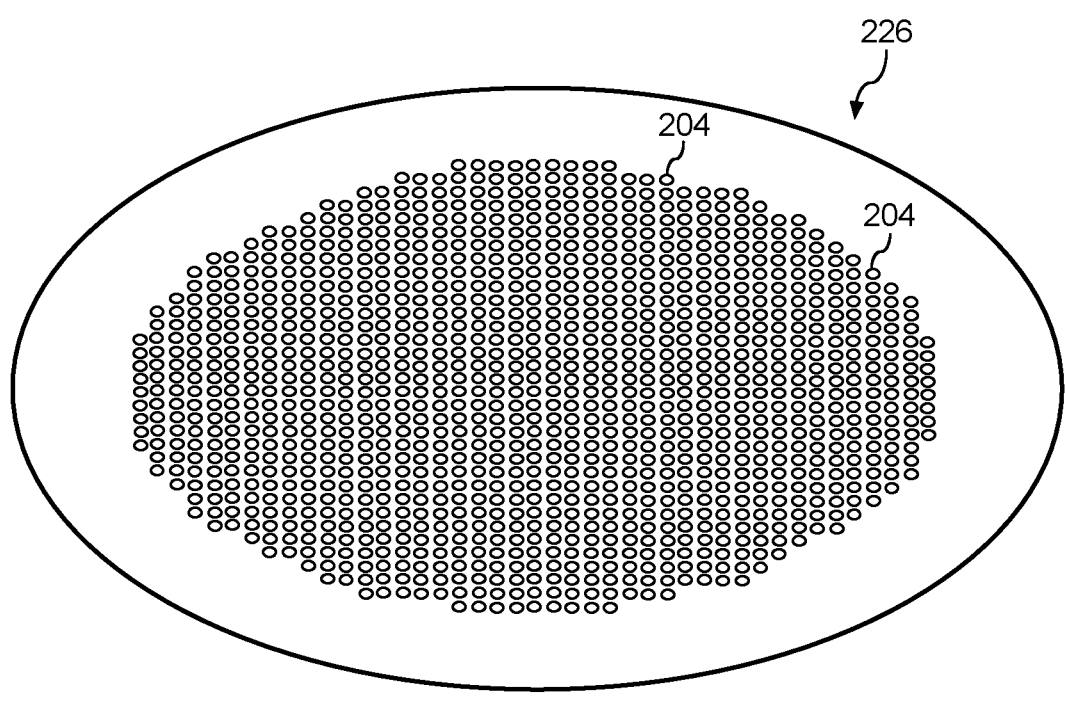
FIG. 13A depicts an example top-down view of an example bottom layer of an example grid assembly according to example embodiments of the present disclosure.
Figure 13B:
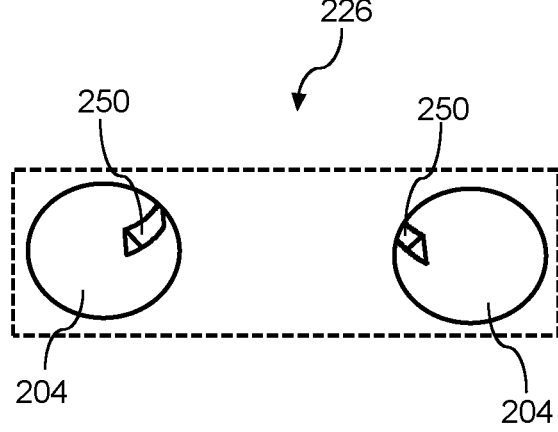
FIG. 13B depicts an enlarged partial view of FIG. 13A.

FIGS. 13A and 13B illustrate an example bottom layer 226 that is adjacent to or integrally formed with a bottom surface of sublayer 228*e*. In other words, bottom layer 226 is located beneath sublayer 228*e* in the z-direction. As shown, bottom layer 226 includes a plurality of nozzles 204. One or more injection apertures 250 coupled to the internal gas injection channels 220 of sublayer 228*e* are coupled to the nozzles 204 in order to deliver process gas to the nozzles 204. As previously described, the nozzles 204 provide an opening about the top surface of the top layer 224 and extend through the z-direction of the grid assembly 202 where one or more openings are provided about a bottom surface of the bottom layer 226. Accordingly, while the nozzles 204 can be formed by any shape, as shown, they are columnar extensions generally having a continuous sidewall extending parallel to the z-direction. In embodiments, the one or more gas injection apertures 250 are configured to intersect the sidewall of the nozzles 204 about a plane that is perpendicular to the z-direction. Accordingly, the gas injection apertures 250 are configured to inject or deliver process gas to the nozzles 204 about a horizontal direction (e.g., in a direction generally perpendicular to the z-direction).

As shown in FIGS. 7A-13B, in certain embodiments, each of the one or more sublayers 228 generally includes an increasing number of internal gas injection channels 220 as the sublayers 228 advance from the top layer 224 down to the bottom layer 226. That is the top-most sublayer (e.g., sublayer 228a adjacent to the top layer 224) includes the fewest number of internal gas injection channels 220, while the bottom-most sublayer (e.g., sublayer 228e adjacent to the bottom layer 226) includes the greatest number of internal gas injection channels 220. In embodiments, the bottom layer 226 comprises more internal gas injection channels 220 as compared to the top layer 224 and/or other sublayers 228.

Importantly, the number of internal gas injection channels 220 disposed in the sublayers 228 can be determined based on the number of desired sublayers between the top layer 224 and the bottom layer 226 and/or the number of nozzles 204 provided in the grid assembly 202. For example, in certain embodiments, if additional sublayers 228 are added, then the number of internal gas injection channels 220 in each sublayer 228 may be decreased. While, in other embodiments, if the number of sublayers 228 is decreased, the number of internal gas injection channels 220 in each of the sublayers 228 can be increased. Additionally, if the number of nozzles 204 is decreased then the number of internal gas injection channels 220 in the sublayers 228 can be decreased and/or the number of sublayers 228 can be decreased. Similarly, in certain embodiments, if the number of nozzles 204 is increased then the number of internal gas injection channels 220 in the sublayers can be increased and/or the number of sublayers 228 can be increased. Branching patterns of the internal gas injection channels 220 can be similarly modified or varied (e.g., increased or decreased) based on the number of nozzles 204 and/or sublayers 204.

Figure 14:
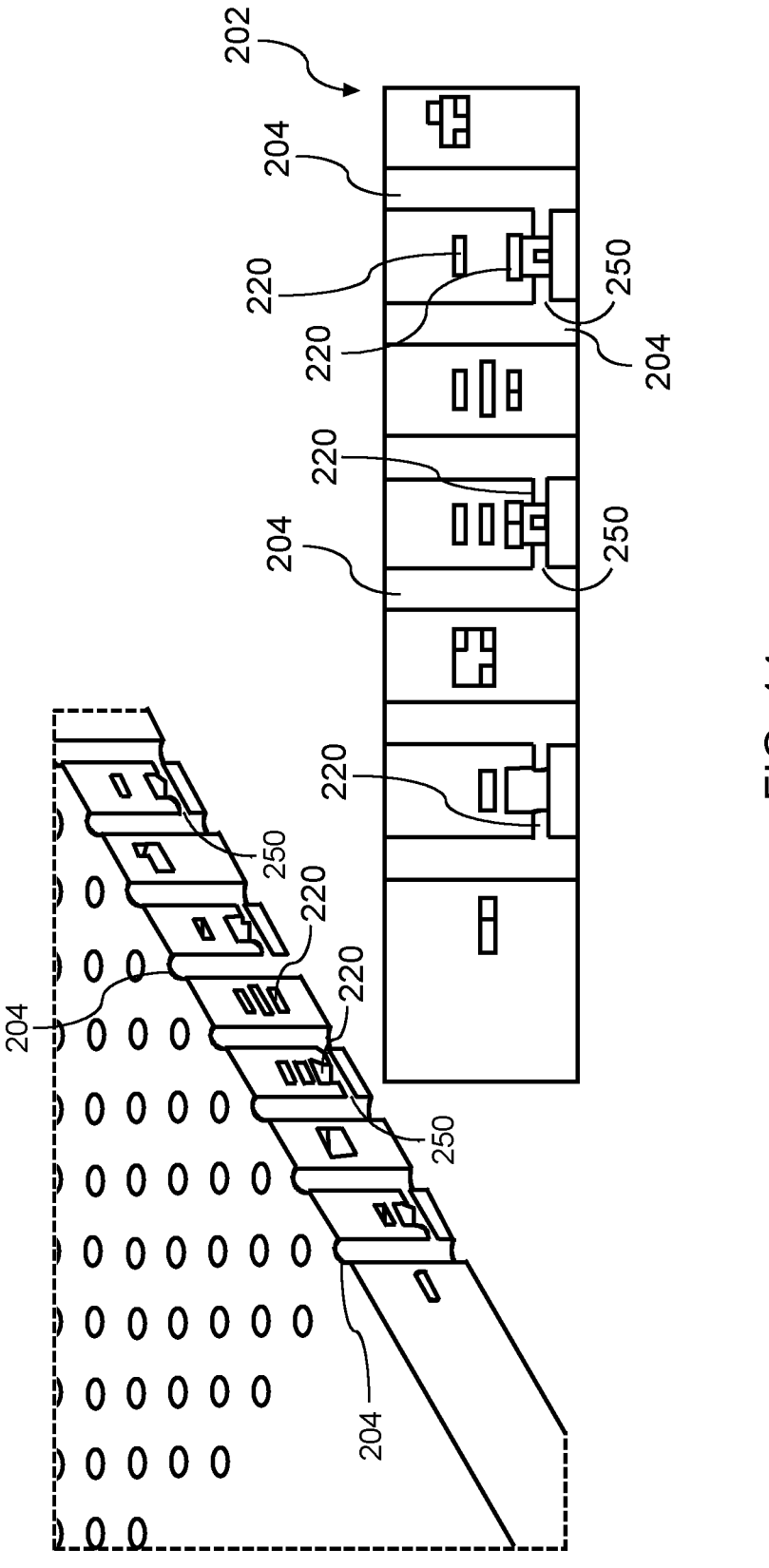
FIG. 14 depicts an example enlarged cross-sectional view of an example grid assembly according to example embodiments of the present disclosure.

FIG. 14 illustrates a cross-sectional view of an example grid assembly 202. As shown, the grid assembly 202 includes a plurality of nozzles 204 and internal gas injection channels 220 disposed within the grid assembly 202. The internal gas injection channels 220 are each connect through the sublayers 228 therein and are configured to supply process gas via one or more gas injection apertures 250 to a nozzle 204. The spacing and placement of the internal gas injection channels 220 can ensure that a flow delivery of process gas to each of the nozzles 204 is substantially uniform and/or includes a substantially equal flow conductance. Accordingly, the configuration of layers (e.g., top layer 224, bottom layer 226, and sublayers 228) in addition to internal gas injection channel 220 patterning is configured to ensure that each of the nozzles 204 is supplied with an equal flow of process gas. Advantageously, the grid assembly 202 can be used to uniformly provide process gas about the surface area of the grid, while being supplied with process gas from only one gas inlet. This eliminates the need for multiple gas inlets in order to more uniformly supply process gas.

Furthermore, aspects of the present disclosure provide a grid assembly 202 having the ability to provide process gas injection via a horizontal plane that is shielded from that is shielded from RF power in the delivery path. The grid assembly 202 can be metal and/or dielectric material. In certain embodiments, the grid assembly 202 can be encapsulated with a metal housing with matching nozzle holes on both the top and bottom or only one side of either the top or the bottom. The gas inlet 206 for injection of process gas into the grid assembly 202 can be on the top, bottom or side of the grid assembly 202.

In embodiments, for each process gas delivery path from gas inlet 206 to each of the nozzles 204 at the bottom of the grid assembly 202, the gas flow has about equal flow conductance for all nozzles 204 (e.g., the process gas delivered at the gas injection aperture 250 into nozzles 204 has about equal flow conductance). In certain embodiments, there may be some boundary effect around the edge of the grid assembly 202 where some of the internal gas injection channels 220 may deliver process gas to only one nozzle, or two nozzles, or three nozzles, that can make it different in flow conductance. This can be reduced by making the diameter of the nozzle area larger than the diameter of the workpiece (e.g., larger than 300 mm in diameter for 300 mm workpieces).

While not shown, in certain embodiments, the grid assembly 202 can be used in apparatus 500 as part of the showerhead assembly for delivering gas from the gas delivery system 150 into the plasma chamber 120. However, in such embodiments the grid assembly may or may not include nozzles extending through the entirety of the grid assembly 202 in the z-direction. Instead, one or more nozzles may be located on the bottom surface of the grid assembly 202 and can receive process gas from the one or more internal gas injection channels 220 as described herein. Still, in other embodiments, the grid assembly 202 can be used as a showerhead in a plasma processing apparatus having a processing chamber and no remote plasma chamber. In such embodiments, plasma can be generated directly in the processing chamber and exposed to the workpiece. In such embodiments, the grid assembly 202 can be used to supply process gas into the processing chamber as described herein. Furthermore, in such embodiments the grid assembly 202 may or may not include nozzles extending through the entirety of the grid assembly 202 in the z-direction, as previously discussed.

Figure 15:
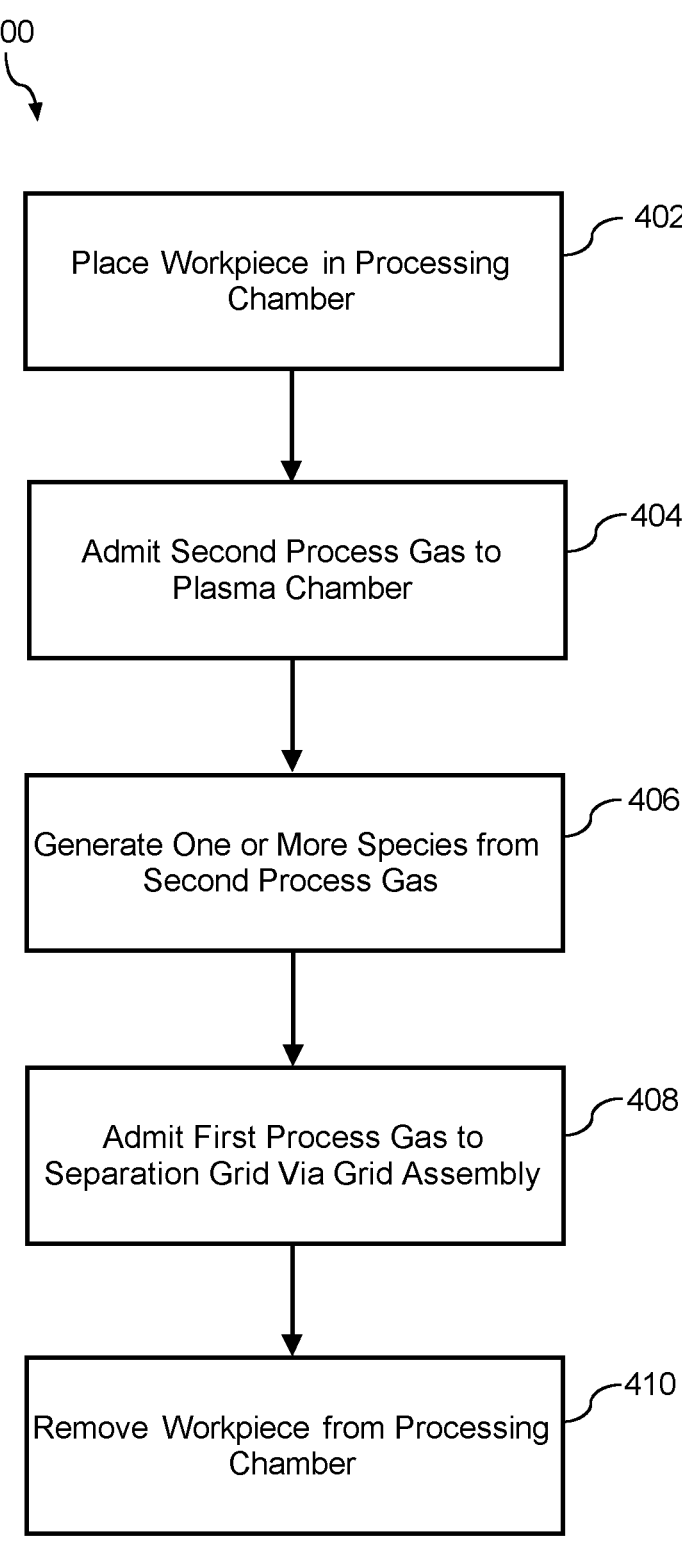
FIG. 15 depicts an example flow diagram of an example workpiece processing method according to example embodiments of the present disclosure.

FIG. 15 depicts a flow diagram of one example method (400) according to example aspects of the present disclosure. The method (400) will be discussed with reference to the plasma processing apparatus 500 of FIG. 1 by way of example. The method (400) can be implemented in any suitable plasma processing apparatus. FIG. 1 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (402), the method can include placing a workpiece 114 in a processing chamber 110 of a plasma processing apparatus 500. The processing chamber 110 can be separated from a plasma chamber 120 (e.g., separated by a separation grid 200 including a grid assembly 202). For instance, the method can include placing a workpiece 114 onto workpiece support 112 in the processing chamber 110. The grid assembly 202 can include a plurality of nozzles extending vertically through at least a portion of the grid assembly and a plurality of layers in a vertical stacked arrangement. The plurality of layers includes a top layer including one or more internal gas injection channels configured to receive the first process gas from the gas inlet, a bottom layer including a plurality of internal gas injection channels having one or more injection apertures configured to deliver the first process gas about a horizontal plane to one or more of the plurality of nozzles, and one or more sublayers disposed between the top layer and the bottom layer, each of the one or more sublayers including an increasing number of internal gas injection channels as the one or more sublayers advance from the top layer to the bottom layer.

At (404) the method can include admitting a second process gas to the plasma chamber 120. For example, the gas delivery system 150 can be used to admit one or more suitable process gases to the plasma chamber 120. In certain embodiments, the grid assembly 202 can be used to deliver process gas to the plasma chamber 120. For example, in certain embodiments, the grid assembly 202 can be disposed as a showerhead connected to the gas delivery system 150 in order to deliver process gas to the plasma chamber 120. In such embodiments, the grid assembly 202 may not include nozzles 204 extending through the entirety of the grid assembly 202, and instead may just include one or more nozzles located in one of the bottom layers of the grid assembly 202 in order to deliver process gas to the plasma chamber 120.

At (406) the method can include generating one or more species from the second process gas using a plasma induced in the plasma chamber 120. For example, the induction coil 130 can be energized with RF power from the RF power generator 134 to generate a plasma 502 in the plasma chamber 120. The plasma 502 can include one or more species, such as charged particles and or neutral species. The one or more species can pass through one or more nozzles 204 in the grid plate assembly 202 of the separation grid 200 an can enter the processing chamber 110 to expose the workpiece 114 to the one or more species.

At (408) the method includes admitting a first process gas to the separation grid 200 via the grid assembly 202, for instance as the one or more species pass from the plasma chamber 120 to the processing chamber 110. For example, as disclosed, the grid assembly can include a plurality of nozzles and one or more internal gas injection channels 220 disposed throughout the layers of the grid assembly 202. The internal gas injection channels 220 can be used to provide process gas and/or mix process gas with the one or more species as the one or more species pass through the nozzles 204. Utilization of the grid assembly 202 as disclosed provides for a flow delivery of the first process gas to each of the plurality of nozzles 204 that is substantially uniform and/or includes a substantially equal flow conductance.

In certain embodiments, the separation grid 200 can be used to filter ions generated by the plasma. The separation grid 200 can have a plurality of holes. Charged particles (e.g., ions) can recombine on the walls in their path through the plurality of holes. Neutral species (e.g. radicals) can pass through the holes. Accordingly, the separation grid 200 including grid assembly 202 can be used to create a filtered mixture that is exposed to the workpiece 114 in the process chamber, in order to process the workpiece. Furthermore, in some embodiments, the workpiece 114 can be exposed to one or more species in order to process the workpiece 114.

At (410) the method can include removing the workpiece from the processing chamber. For instance, the workpiece 114 can be removed from workpiece support 112 in the processing chamber 110. The plasma processing apparatus can then be conditioned for future processing of additional workpieces.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A grid assembly for injecting process gas to a chamber, comprising:
   a gas inlet for delivering the process gas to the grid assembly;
   a plurality of nozzles extending vertically through at least a portion of the grid assembly;
   a plurality of layers in a vertical stacked arrangement, including:
      a top layer comprising one or more first internal gas injection channels configured to receive process gas from the gas inlet, the one or more first internal gas injection channels are separate from the plurality of nozzles;
      a bottom layer comprising a plurality of second internal gas injection channels separate from the plurality of nozzles having one or more injection apertures configured to deliver the process gas about a horizontal plane to one or more of the plurality of nozzles; and
      a plurality of sublayers disposed between the top layer and the bottom layer, each one of the plurality of sublayers comprising an increasing number of internal gas injection channels as the plurality of sublayers advance from the top layer to the bottom layer.

2. The assembly of claim 1, wherein the plurality of sublayers comprises at least five sublayers.

3. The assembly of claim 1, wherein the top layer, bottom layer, and the plurality of sublayers are integrally formed.

4. The assembly of claim 1, wherein the bottom layer comprises more internal gas injections channels as compared to the top layer and/or the plurality of sublayers.

5. The assembly of claim 1, wherein the grid assembly comprises a dielectric material.

6. The assembly of claim 1, wherein the grid assembly comprises a metal material.

7. The assembly of claim 1, wherein the chamber comprises a processing chamber.

8. The assembly of claim 1, wherein the chamber comprises a plasma chamber.

9. The assembly of claim 1, wherein a flow delivery of process gas to each of the plurality of nozzles is substantially uniform and/or includes a substantially equal flow conductance.

10. The assembly of claim 1, wherein the assembly comprises a separation grid for a plasma processing apparatus.

11. A plasma processing apparatus for processing a workpiece, the plasma processing apparatus comprising:
   a processing chamber;
   a workpiece support disposed within the processing chamber, the workpiece support configured to support the workpiece during processing;
   a plasma chamber separated from the processing chamber via a separation grid; and
      an inductively coupled plasma source configured to generate a plasma in the plasma chamber;
   wherein the separation grid comprises a grid assembly including:

a gas inlet for delivering a first process gas to the grid assembly;

a plurality of nozzles extending vertically through at least a portion of the grid assembly;

a plurality of layers in a vertical stacked arrangement, including:

a top layer comprising one or more first internal gas injection channels configured to receive the first process gas from the gas inlet, the one or more first internal gas injection channels are separate from the plurality of nozzles;

a bottom layer comprising a plurality of second internal gas injection channels separate from the plurality of nozzles having one or more injection apertures configured to deliver the first process gas about a horizontal plane to one or more of the plurality of nozzles; and a plurality of sublayers disposed between the top layer and the bottom layer, each one of the plurality of sublayers comprising an increasing number of internal gas injection channels as the plurality of sublayers advance from the top layer to the bottom layer.

12. The plasma processing apparatus of claim 11, wherein the one or more nozzles of the grid assembly are configured to allow for one or more species generated in the plasma to move from the plasma chamber to the processing chamber.

13. The plasma processing apparatus of claim 11, comprising a gas delivery system configured to delivery one or more second process gases to the plasma chamber.

14. The plasma processing apparatus of claim 11, wherein the top layer, bottom layer, and the plurality of sublayers are integrally formed.

15. The plasma processing apparatus of claim 11, wherein the plurality of sublayers comprises at least five sublayers.

16. The plasma processing apparatus of claim 11, wherein the bottom layer comprises more internal gas injections channels as compared to the top layer and/or the plurality of sublayers.

17. The plasma processing apparatus of claim 11, wherein each of the one or more internal gas injection channels in the bottom layer are configured to provide the first process gas to at least four nozzles.

* * * * *